(12) United States Patent
Watkins et al.

(10) Patent No.: US 7,363,694 B2
(45) Date of Patent: Apr. 29, 2008

(54) METHOD OF TESTING USING COMPLIANT CONTACT STRUCTURES, CONTACTOR CARDS AND TEST SYSTEM

(75) Inventors: Charles M. Watkins, Eagle, ID (US); Kyle K. Kirby, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 11/336,538

(22) Filed: Jan. 20, 2006

(65) Prior Publication Data

US 2006/0137171 A1    Jun. 29, 2006

Related U.S. Application Data

(62) Division of application No. 11/121,276, filed on May 3, 2005, which is a division of application No. 10/684,621, filed on Oct. 14, 2003, now Pat. No. 7,030,632.

(51) Int. Cl.
*G01R 31/28* (2006.01)
(52) U.S. Cl. ............... 29/593; 29/592.1; 29/832; 29/854; 324/754; 324/755; 324/765; 438/17; 438/611; 438/639
(58) Field of Classification Search ............... 29/592.1, 29/593, 832, 854; 324/754, 755, 765; 438/17, 438/611, 639
See application file for complete search history.

(56) References Cited

U.S. PATENT DOCUMENTS

| 4,008,300 | A | 2/1977 | Ponn |
|---|---|---|---|
| 4,402,562 | A | 9/1983 | Sado |
| 4,408,814 | A | 10/1983 | Takashi et al. |
| 5,042,148 | A | 8/1991 | Tada et al. |
| 5,172,050 | A | 12/1992 | Swapp |
| 5,476,211 | A | 12/1995 | Khandros |
| 5,665,648 | A | 9/1997 | Little |
| 5,785,538 | A | 7/1998 | Beaman et al. |
| 5,823,830 | A | 10/1998 | Wurster |
| 5,864,946 | A | 2/1999 | Eldridge et al. |
| 5,884,398 | A | 3/1999 | Eldridge et al. |
| 5,926,029 | A | 7/1999 | Ference et al. |
| 6,096,636 | A | 8/2000 | Manning |
| 6,184,053 | B1 | 2/2001 | Eldridge et al. |
| 6,184,065 | B1 | 2/2001 | Smith et al. |
| 6,218,848 | B1 | 4/2001 | Hembree et al. |
| 6,246,250 | B1 * | 6/2001 | Doherty et al. ............. 324/765 |
| 6,268,015 | B1 | 7/2001 | Mathieu et al. |
| 6,292,003 | B1 | 9/2001 | Fredrickson et al. |
| 6,300,786 | B1 * | 10/2001 | Doherty et al. ............. 324/765 |
| 6,310,484 | B1 | 10/2001 | Akram et al. |
| 6,337,577 | B1 * | 1/2002 | Doherty et al. ............. 324/765 |
| 6,366,112 | B1 * | 4/2002 | Doherty et al. ............. 324/765 |
| 6,466,043 | B2 | 10/2002 | Khoury et al. |
| 6,475,822 | B2 | 11/2002 | Eldridge et al. |
| 7,030,632 | B2 | 4/2006 | Watkins et al. |

\* cited by examiner

*Primary Examiner*—Paul D. Kim
(74) *Attorney, Agent, or Firm*—TraskBritt

(57) ABSTRACT

A compliant contact structure and contactor card for operably coupling with a semiconductor device to be tested includes a substantially planar substrate with a compliant contact formed therein. The compliant contact structure includes a portion fixed within the substrate and at least another portion integral with the fixed portion, laterally unsupported within a thickness of the substrate and extending beyond a side thereof. Dual-sided compliant contact structures, methods of forming compliant contact structures, a method of testing a semiconductor device and a testing system are also disclosed.

3 Claims, 8 Drawing Sheets

METHOD OF TESTING USING COMPLIANT CONTACT STRUCTURES, CONTACTOR CARDS AND TEST SYSTEM

CROSS-REFERENCE TO RELATED APPLICATIONS

This application is a divisional of application Ser. No. 11/121,276, filed May 3, 2005, which is a divisional of application Ser. No. 10/684,621, filed Oct. 14, 2003, now U.S. Pat. No. 7,030,632, issued Apr. 18, 2006.

BACKGROUND OF THE INVENTION

1. Field of the Invention

The present invention relates to testing semiconductor devices including integrated circuits and, more particularly, to a compliant contact structure for connecting electrical signals to integrated circuits during testing of the integrated circuits.

2. State of the Art

Semiconductor devices, from microprocessors to memory chips, are fabricated by performing a long series of processes including depositing various materials, selectively masking, and etching on a semiconductor wafer or other bulk semiconductor substrate. Many identical integrated circuits may be fabricated on a single semiconductor wafer by forming the integrated circuits in arrays of semiconductor die locations across the wafer. Ultimately, semiconductor dice bearing the individual integrated circuits are singulated from the wafer and are either further processed, including packaging and additional testing, or discarded when they are determined to be defective in one or more aspects and the defect or defects cannot be remediated.

Due to inadequacies in processing or other defects in the semiconductor wafer, certain ones of the integrated circuits will not function as designed. Such defects may be detected initially or may not become apparent until an integrated circuit has been in operation for a period of time. Therefore, it is desirable to test and electrically stress the integrated circuits to determine which circuits are operational and which ones are defective or likely to become defective.

Semiconductor integrated circuits are typically subjected to a series of test procedures during the manufacturing process in order to verify functionality and reliability. Typical test approaches include wafer probe testing in which integrated circuits are individually tested to determine the operational characteristic of each before singulation from the semiconductor wafer.

Conventionally following initial testing, semiconductor dice bearing the integrated circuits are singulated into individual integrated circuit dice or "chips" with the operational chips usually being further assembled or otherwise processed into semiconductor die packages suitable for installation on higher-level packaging. The semiconductor die packages are then burned in by loading them into sockets on burn-in boards and electrically operating the semiconductor die packages through programmed test sequences at cyclically varied and elevated temperatures for an extended testing period. Burn-in induces premature failure in marginally operative semiconductor devices which may have passed probe testing, allowing such devices to be screened out before they are installed on higher-level packaging or sold to a third party. Burning-in and testing of packaged devices are typically accomplished through the use of sockets particularly suited for the burn-in conditions and high speed testing. Accordingly, conventional manufacturing and testing processes are expensive and time consuming because of the repeated handling and testing of individual semiconductor devices and because individually tested and handled semiconductor devices that ultimately fail have wasted costly resources and time.

A considerable advantage in cost and process time could be attained by burning-in and testing a semiconductor wafer before it is singulated into discrete devices. Additional savings may be recognized by forgoing packaging of devices that ultimately fail-once subjected to burn-in conditions. A considerable effort has been expended to develop effective methods for wafer level testing. One such approach utilizes cantilevered or spring-wire probes which are placed on a contactor or probe card for simultaneous contact to all of the devices on the semiconductor wafer. Such contactor cards are expensive to manufacture and result in undesirable electrical characteristics such as increased inductance along parallel wires. Furthermore, conventional contactor cards are generally fabricated from materials having dissimilar expansion coefficients than the semiconductor substrate, for example, a semiconductor wafer (hereinafter "wafer-under-test") undergoing testing. Therefore, conventional contactor cards exhibit a markedly dissimilar expansion to the wafer-under-test over temperature extremes characteristic of burn-in testing and may result in misalignment of the contactor card contact pins with the corresponding integrated circuit contact pads (bond pads) on the semiconductor wafer-under-test.

Therefore, there is a need for providing a contact fabrication methodology which results in a highly economical and manufacturable, high precision apparatus for contacting bond pads of individual semiconductor devices in a wafer-level testing environment.

BRIEF SUMMARY OF THE INVENTION

The present invention comprises, in various embodiments, a compliant contact structure, a contactor card and test system including same, and methods of fabrication and use associated therewith. In one embodiment of the present invention, a compliant contact structure includes a substantially planar substrate having a thickness, including a compliant contact being secured therein and extending transversely thereto. The compliant contact includes a portion fixed within the substrate and at least another portion integral with the fixed portion and laterally unsupported within the thickness of the substrate and extending therebeyond. Opposing portions of the same compliant contact may be unsupported to provide a dual-sided compliant contact structure, with a medial portion of the contact fixed to the substrate. Adjacent compliant contact structures having laterally unsupported portions extending beyond opposing sides of the substrate may be mutually operably coupled to provide a dual-sided compliant contact structure.

In another embodiment of the present invention, a method for forming a compliant contact structure is provided. A contact slot extending between a first side and a second side of a substantially planar substrate is formed at a selected location. The contact slot is filled with a conductive material to form a conductive pin. A portion of the substrate immediately surrounding and laterally supporting a portion of the conductive pin is removed to a selected depth within the substrate with the remaining portion of the conductive pin remaining fixed to the substrate, the thickness of the substrate also being generally reduced adjacent the removed portion of the substrate. The exposed, unsupported portion of the conductive pin extends beyond the substrate and provides a compliant contact element. Opposing portions of the substrate may be removed to leave a medial portion of the conductive pin supported and thus form a dual-sided compliant contact structure. Adjacent, but opposingly facing, compliant contacts may be formed and operably coupled to form a dual-sided compliant contact structure.

In yet another embodiment of the present invention, a method of testing a semiconductor substrate is provided. At least one contact pad of a semiconductor substrate is aligned with a corresponding compliant contact of a contactor card. The contactor card includes a substantially planar, rigid substrate having a thickness and carrying at least one compliant contact. The at least one compliant contact comprises a conductive pin including a portion fixed within a portion of the card substrate and at least another portion integral with the fixed portion laterally unsupported within the thickness of the card substrate, extending transversely to the plane of the card substrate and beyond at least one side thereof. The contactor card is pressed against the semiconductor substrate to resiliently bias the unsupported portion of the conductive pin, which provides a compliant contact and effects a resilient contact between a distal end of the at least another unsupported portion of the contact pin and the at least one contact pad on the semiconductor substrate. At least one test signal is applied to an integrated circuit associated with the at least one contact pad through the at least one compliant contact and analyzed by a tester operably coupled to the at least one compliant contact.

In yet a further embodiment of the present invention, a semiconductor substrate testing system includes a contactor card operably coupled to a tester configured for applying and receiving test signals from an integrated circuit carried on a semiconductor substrate. The contactor card includes a substantially planar, rigid substrate carrying at least one compliant contact. The at least one compliant contact comprises a conductive pin including a portion fixed within a portion of the substrate and at least another portion integral with the fixed portion laterally unsupported within the thickness of the card substrate, extending transversely to the plane of the card substrate and beyond at least one side thereof.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention, according to the various embodiments described herein, is drawn to compliant contact structures, methods of fabricating same, and methods for testing using the compliant contact structures. The various views and diagrams are illustrated generally as cross sectional views for clarity; however, the specific formed profiles and devices may be arranged across the surface of the substrate and with various orientations and geometries appreciated by those of ordinary skill in the art.

Figure 1:
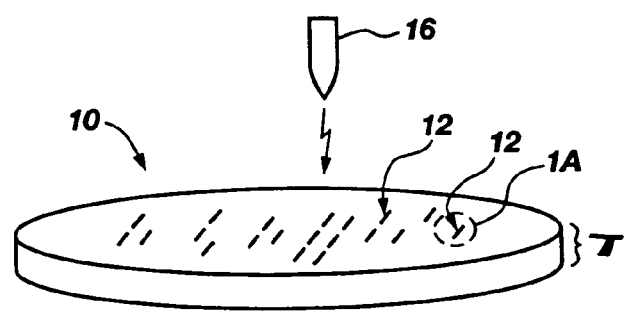
FIGS. 1 and 1A respectively illustrate a perspective view of a substrate and an enlarged perspective view of a portion of the substrate suitable for forming a compliant contact structure in accordance with an embodiment of the present invention.

While the various embodiments of the present invention find general application to providing electrical coupling in small dimensions, one exemplary specific application of the various embodiments includes the formation of one or more compliant contact structures for use in conjunction with the fabrication of a contactor card for coupling to integrated circuits on a semiconductor substrate such as, for example, a semiconductor wafer-under-test during wafer level test probing of semiconductor wafers. By way of example, FIG. 1 illustrates a generally planar substrate 10 having defined thereon one or more locations 12 for the formation of a compliant contact structure. In an exemplary embodiment of the present invention, substrate 10 exhibits a coefficient of thermal expansion (CTE) similar to the CTE of a semiconductor substrate bearing integrated circuitry to be tested in order to minimize any potential for temperature-induced contact misalignment over temperature extremes. For example and not by way of limitation, substrate 10 may itself comprise a semiconductor material such as silicon, or a ceramic exhibiting a CTE similar to that of silicon.

Figure 1A:
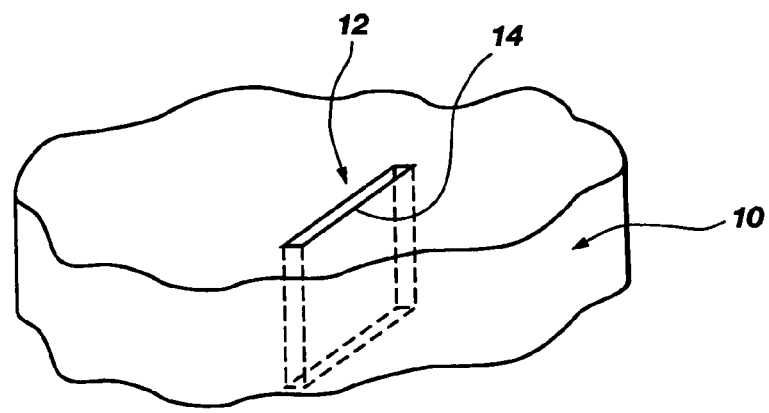

At each of the locations 12, a compliant contact structure is formed by processing the substrate 10 as described below and substantially simultaneously forming in one or more locations 12 a compliant contact structure. The perspective views of FIGS. 1 and 1A illustrate the formation of contact slots 14 in one or more locations 12 on a substrate 10. Contact slots 14 may be formed through a thickness T of substrate 10 by a suitable material removal process such as, for example, through the use of a laser 16 to ablate portions of substrate 10 for the formation of contact slots 14 in which resilient or compliant, spring-like contacts may be formed. Laser ablation may be performed by a micromachine laser such as the XCISE 200 available from XSIL, Ltd. of Dublin, Ireland. While various laser configurations are suitable for use in the processes of the embodiments of the present invention, one exemplary laser operates at approximately 7 watts and is a 355 nanometer pulse laser.

By way of further example and not limitation, contact slot 14 may also be formed through chemical etching or mechanical machining techniques. While chemical etching and mechanical drilling or boring are contemplated as within the scope of the present invention, laser machining generally provides improved processing time over each of the other techniques. Using the exemplary laser at a pulse rate of 40 kHz, approximately 3-5 microns of substrate depth may be ablated with the activation of each pulse, which is a marked improvement over etch rates achievable by chemical etching processes (e.g., a dry etch process), is more controllable than a wet etch, and is less likely to cause unacceptable collateral damage to substrate 10 than mechanical machining.

Further, by way of example and not limitation, the relative lateral dimensions of contact slot 14 are sized so as to provide a compliant coupling mechanism with a prospective mating substrate such as, for example, a semiconductor wafer-under-test having integrated circuits thereon. While FIGS. 1 and 1A illustrate contact slot 14 as being rectangular in nature, other geometries are also contemplated including square, circular, oval or elliptical and other polygonal profiles. Slot configuration in the X-Y plane, the plane of the substrate 10, may be selected to provide a preferential direction for bending of the compliant contact. The dimensions of contact slot 14 may be determined by several factors including the resiliency of the selected conductive composition or metal for filling contact slot 14 and the mating interface dimensions, for example, of the contact pad of the semiconductor device to be tested, such as a wafer-under-test. By way of example only, the dimensions of contact slot 14 may assume dimensions on the order of 10-20 microns by 60-80 microns.

As a further process in the formation of contact slot 14, when laser machining or other coarse substrate removal techniques are utilized, a cleaning process may further be employed to soften any rough edges and to clean any heat-damaged substrate (commonly termed the "heat affected zone," or HAZ) from the respective contact slots 14. By way of example and not limitation, if substrate 10 is formed of silicon, an exemplary cleaning process may include TetraMethyl Ammonium Hydroxide (TMAH) or Propylene Glycol TMAH as an etching agent. Other substrate post-process cleaning processes are contemplated and the specific application of these processes is known by those of ordinary skill in the art and is not further described herein.

Figure 2A:
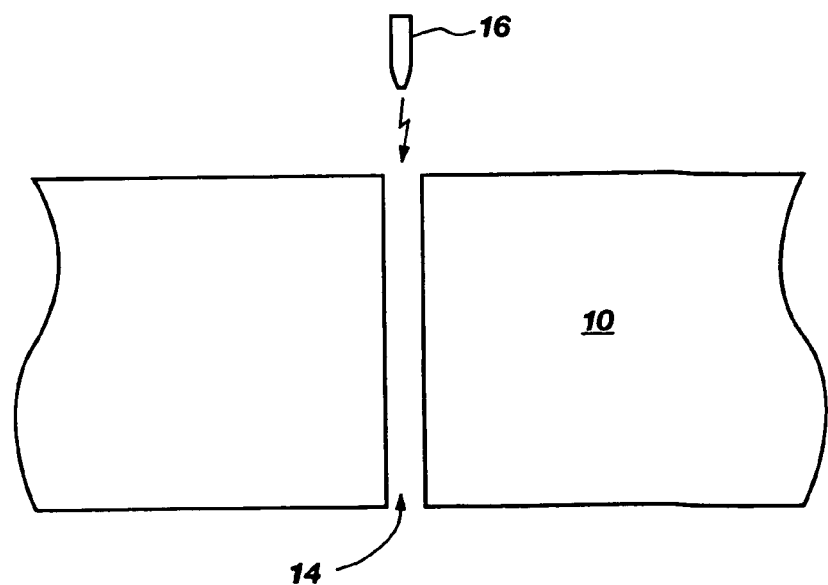
FIGS. 2A-2F are cross-sectional views illustrating a sequence of processing steps for fabricating a compliant contact structure according to an embodiment of the present invention.

FIGS. 2A-2F illustrate cross-sectional views of processing steps for the formation of a compliant contact structure in accordance with an embodiment of the present invention. In FIG. 2A, a contact slot 14 is formed through the entire thickness of substrate 10 through the utilization of one or more machining techniques, and/or etching techniques suitable for forming contact slot 14. By way of example and not limitation, the machining tool is illustrated as a laser 16 which ablates portions of substrate 10 to form contact slot 14. While FIGS. 2A-2F illustrate the formation of an individual compliant contact structure, the present invention additionally contemplates the formation of a plurality of compliant contact structures in predetermined arrays or other patterns across one or more regions of substrate 10 for interfacing, for example, with a plurality of contact pads on one or more integrated circuits on a semiconductor substrate such as a wafer-under-test.

Figure 2B:
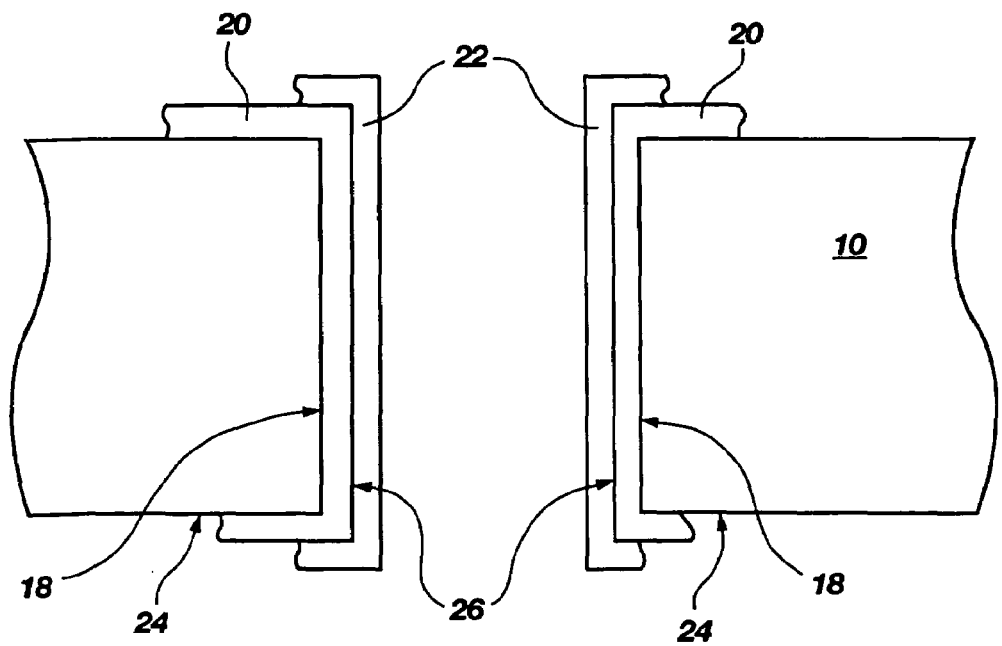

Regarding FIG. 2B, substrate 10, in one embodiment of the present invention, is comprised of a semiconductive material such as silicon which, if directly coupled to a target contact pad of a semiconductor substrate such as a wafer-under-test having integrated circuits thereon, may present undesirable loading or shorting to the electronic circuitry under test. If substrate 10 is comprised of a semiconductive or conductive material, then electrical conductivity of the compliant contact structure to be formed on substrate 10 is passivated by forming an insulative or dielectric layer 20 on sidewalls 18 of contact slot 14 which coats contact slot 14 by coating the substrate 10 with a suitable dielectric material appropriate for the type of composition of substrate 10. The dielectric layer 20 may be comprised of spin-on-glass, thermal oxide, PARYLENE® polymer, silicon dioxide, silicon nitride, silicon oxynitride, a glass, i.e., borophosphosilicate glass, phosphosilicate glass or borosilicate glass, or any dielectric having a low dielectric constant known by those of ordinary skill in the art. To accomplish the passivation, the dielectric layer 20 may be deposited or formed to any desired thickness using any known process suitable for the dielectric material in question including, without limitation, physical vapor deposition (PVD), chemical vapor deposition (CVD), low pressure chemical vapor deposition (LPCVD), rapid thermal nitridation (RTN), a spin-on-glass (SOG) process, flow coating or any other known process. In other embodiments, the dielectric layer 20 may comprise an insulating polymer, such as BT resin, polyimide, benzocyclobutene or polybenzoxazole deposited using an injection or capillary process or a vacuum draw. The insulative layer 20 may be, for example, of about 1 to 5 μm in thickness. If substrate 10 comprises an electrically insulating material, such as suitable ceramic, then dielectric layer 20 may be omitted.

A seed layer may be used to form a catalyst for the deposition of an electrically conductive layer within contact slot 14. As shown in FIG. 2B, a seed layer 22 of a conductive material may be deposited over the outer surface 24 and inner surface 26 of the contact slot 14 and coats the insulative layer 20. In the illustrated embodiment, the seed layer 22 comprises titanium nitride (TiN) and is deposited by CVD. Other materials that may be used as the seed layer 22 include, without limitation, titanium (Ti), silicon nitride ($Si_3N_4$), a polysilicon, palladium (Pd), and tin (Sn). Other deposition processes that may be used to deposit a seed layer 22 include PVD, vacuum evaporation, and sputtering. It will be apparent that the selection of the type of material and deposition process utilized to deposit the seed layer 22 may vary depending on the type of desired material used to form the electrically conductive portion of the compliant contact structure within the contact slot 14.

Figure 2C:
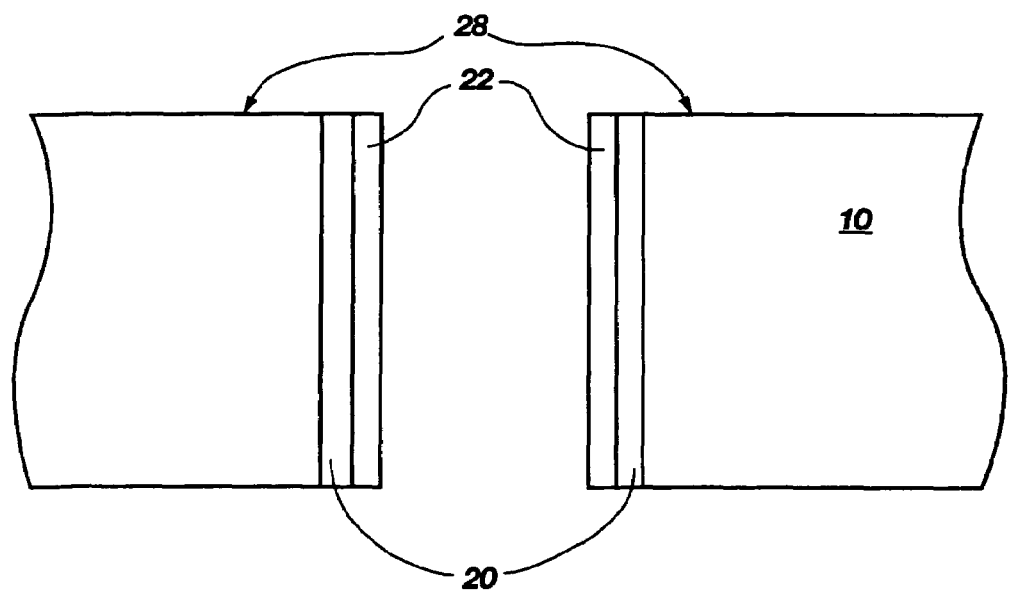

A portion of the seed layer 22 covering the outer surface 24 of the substrate 10 is removed to expose the substrate surface 28 of the substrate 10 as illustrated in FIG. 2C. In the illustrated embodiment, the removed portions of seed layer 22 may be removed by an abrasive planarization process such as chemical mechanical planarization (CMP). However, the selective removal of the seed layer 22 may be accomplished using any other known process such as a wet etch or a dry etch using an etchant appropriate for the type of material making up the seed layer 22 after masking the portion of seed layer 22 within the contact slot 14.

In another exemplary embodiment, the outer surface 24 (FIG. 2B) of the substrate 10 may be coated with a silicon nitride layer to prevent the seed layer 22 from being deposited on the outer surface 24 of the substrate 10 in order to prevent peeling which may occur depending on the type of conductive material used to coat the surfaces of the substrate 10 and the type of substrate 10 used. The contact slot 14 may be masked to prevent the silicon nitride layer from being formed in the contact slot 14 or the nitride layer may be formed on the outer surface 24 of the substrate 10 before the contact slot 14 is formed therein. In addition to using a silicon nitride layer, it will be apparent by those of ordinary skill in the art that any other material that prevents the seed layer 22 from being deposited on the outer surface 24 of the substrate 10, such as a resist layer, may be used.

Figure 2D:
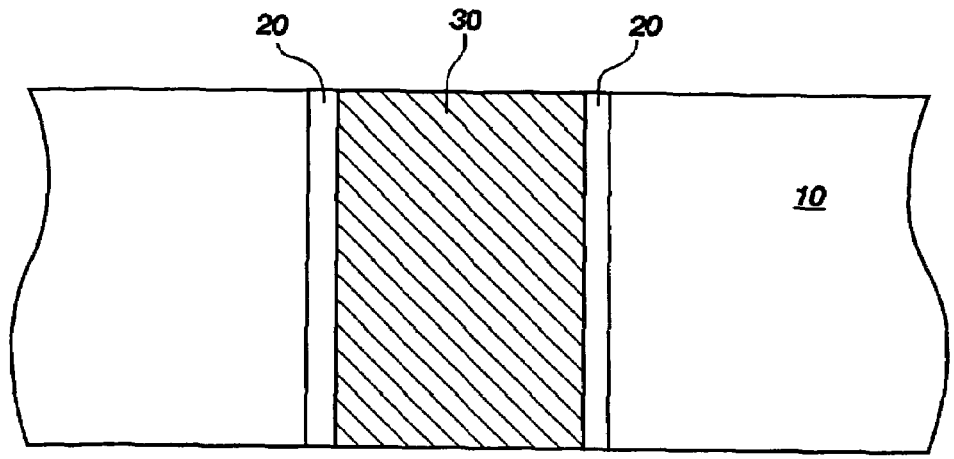

The seed layer 22 is coated with a conductive layer for forming a conductor 30 of metal as illustrated in FIG. 2D using, for example, an electroless deposition process. The conductor 30 is deposited on the seed layer 22 and not on the exposed outer surfaces 24 (FIG. 2B) of the substrate 10 since the seed layer 22 was removed from (or never present on) these surfaces and the electroless deposition process requires the seed layer 22 for deposition of the conductor 30. The conductor 30 may comprise any type of metal including, but not limited to, nickel, cobalt, copper, silver, aluminum, titanium, iridium, gold, tungsten, tantalum, molybdenum, platinum, palladium, nickel-phosphorus (NiP), palladium-phosphorus (Pd—P), cobalt-phosphorus (Co—P), a Co—W—P alloy, other alloys of the foregoing metals and mixtures thereof. While these various metals may provide the appropriate electrical conductivity, the present embodiments of the present invention further rely upon the resiliency and compliant characteristic of the selected conductor material as exhibited under a flexure application. Therefore, the embodiments of the present invention find materials such as nickel, copper, or silver as suitable conductive materials for conductor 30, including copper with nickel or chromium coating, and may further include multiple processed conductive materials including an initial coating within dielectric layer 20 of, for example, gold followed by the further deposition of a different conductor material within the gold layer. Therefore, while FIG. 2D illustrates the formation of conductor 30 as a single step process for simplicity, the present invention also contemplates a multiple step formation of conductor 30.

By coating and continuously plating the seed layer 22, a solid conductor 30 comprised of a suitable metal is created in the contact slot 14. The electroless plating process forms a substantially planar conductor in the contact slot 14 that is substantially free of any voids or keyholes. The electroless plating process is accomplished by placing the substrate 10 into a bath containing an aqueous solution of the metal to be deposited in ionic form. The aqueous solution also includes a chemical reducing agent such that the metal may be deposited without the use of electrical energy. The driving force for the reduction of the metal ions and subsequent deposition in the electroless plating process is driven by the chemical reducing agent. The reduction reaction is essentially constant at all points on the seed layer 22 so long as the aqueous solution is sufficiently agitated (for example, by ultrasound) to ensure that a uniform concentration of metal ions and reducing agents are distributed in the aqueous solution.

Figure 2E:
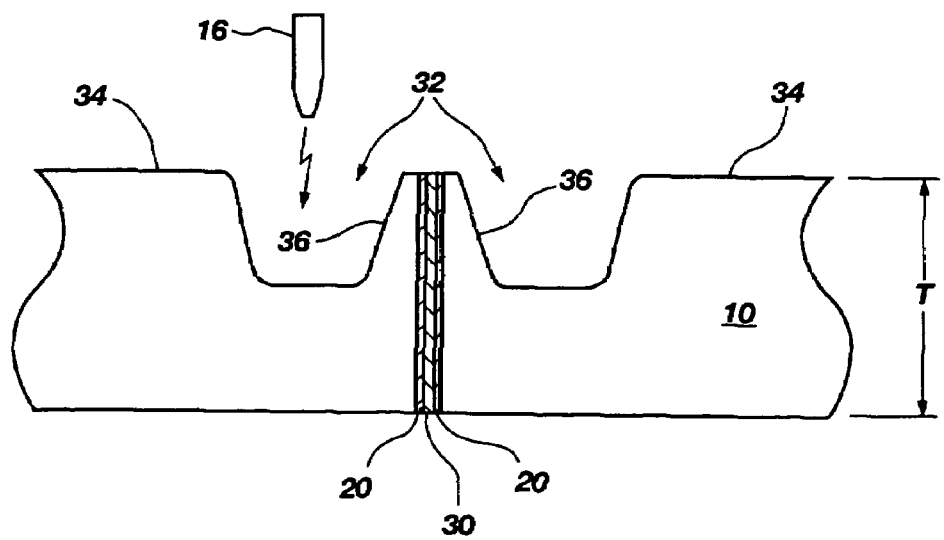

FIG. 2E illustrates a further processing step for forming a compliant contact structure, in accordance with an embodiment of the present invention. As shown, a contact bulk pit 32 is formed on a contact or first side of substrate 10 beginning at a contact side original surface 34 and extending into the thickness T of substrate 10 while circumscribing conductor 30. While various substrate removal techniques are contemplated, including chemical and mechanical etching, laser 16 illustrates use of an ablation process for forming the contact bulk pit 32 within substrate 10. Because of the collateral effects of laser ablating and further due to the relatively imprecise nature of laser machining, contact sidewalls 36 of substrate material are retained around conductor 30. The dimensions of the contact bulk pit 32 are determinable based upon the lateral cross-sectional (X-Y plane) dimensions of conductor 30 which will, in part and in combination with the conductive material selected for conductor 30, determine the stiffness or resiliency of the compliant contact structure being formed. By way of example, for a substrate of approximately 750 microns thickness, an exemplary depth of the contact bulk pit 32 may be approximately 300 microns while the width of one side of the contact bulk pit 32 may be approximately 100 microns. The depth of the contact bulk pit 32 generally defines the approximate length of the flexible portion of the resulting compliant contact structure.

Figure 2F:
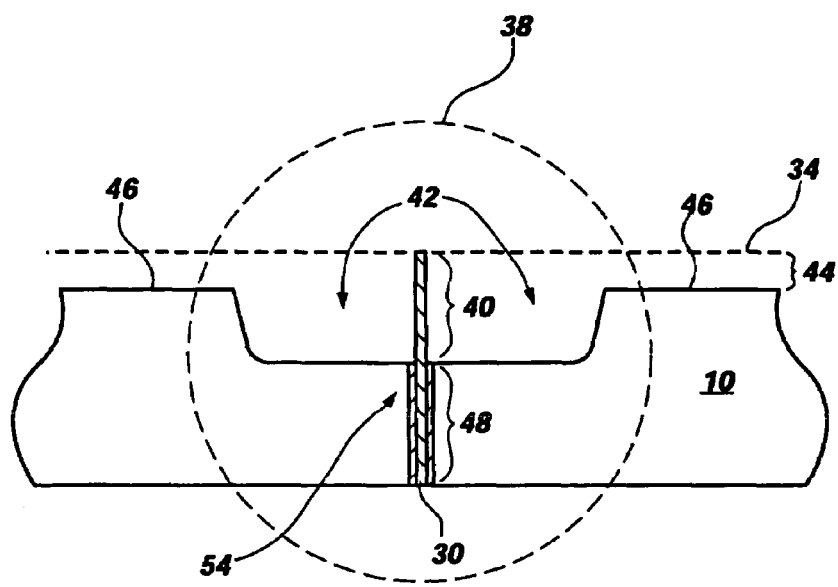

FIG. 2F illustrates a further substrate material removal process for further forming a compliant contact structure 38. A further substrate removal process includes one of the substrate etching processes described above which is preferential or selected for the material of substrate 10, for example silicon, and preferentially does not significantly etch the conductor 30. One example of such a preferential etch process is a TMAH: glycol wet etch process. The selected etch process removes portions of substrate 10 including contact sidewalls 36 (FIG. 2E) and dielectric layer 20, resulting in a compliant contact structure 54 which includes a laterally unsupported portion 40 of conductor 30 and a portion 48 of conductor 30 fixed within substrate 10. Portion 48 is retained securely within substrate 10 and (if necessary) electrically insulated therefrom by dielectric layer 20 to facilitate electrical continuity and structural support of laterally unsupported portion 40 of conductor 30, which is free to flex within contact recess 42.

Figure 3:
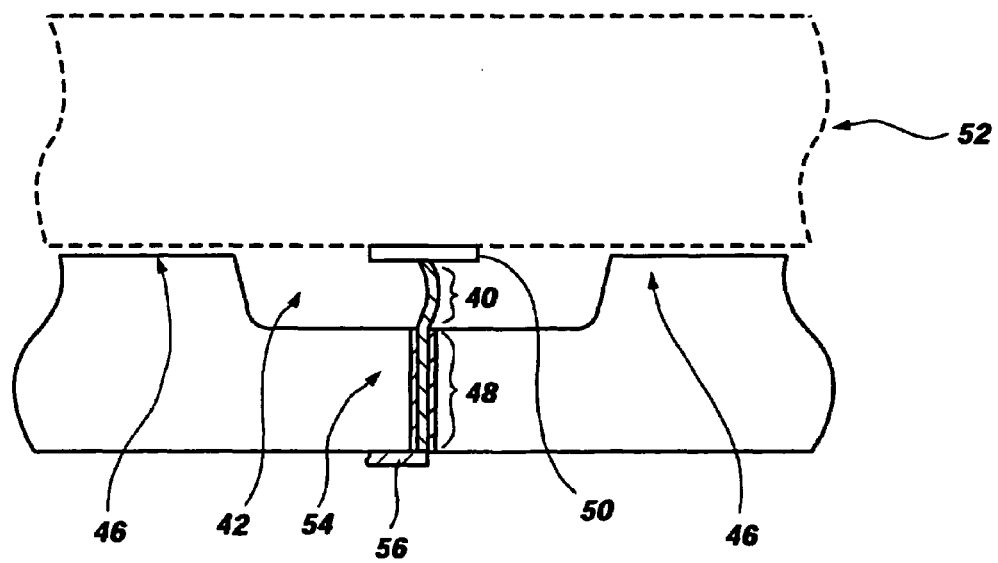
FIG. 3 illustrates a contactor card having a compliant contact structure thereon operably coupling with a wafer-under-test, in accordance with an embodiment of the present invention.

Additionally, the substrate material removal process used for removal of contact sidewalls 36 also provides exposure of laterally unsupported portion 40 of compliant contact structure 54 beyond substrate 10 by recessing the original surface 34 of substrate 10 by a compliance distance 44 to form a contact side stop 46. The recessing of contact side stop 46 from the original location of original surface 34 induces flexure of laterally unsupported portion 40 of compliant contact structure 54 during coupling of compliant contact structure 38 with a semiconductor substrate bearing integrated circuitry to be tested. FIG. 3 illustrates the coupling of compliant contact structure 54 with a contact pad 50 of an exemplary semiconductor substrate comprising a wafer-under-test 52. As noted above, removal of contact sidewalls 36 (FIG. 2E) further results in the formation of a contact recess 42 (FIG. 2F) configured to accept therein without interference a contact pad 50 of, for example, the wafer-under-test 52 operably coupled to laterally unsupported portion 40 of compliant contact structure 54. Electrical continuity from compliant contact structure 54 may be extended to another location on substrate 10 opposite the surface disposed adjacent the wafer-under-test 52 by forming a rerouting conductor element 56 contiguous with portion 48 of conductor 30 of compliant contact structure 54 fixed within substrate 10 and extending thereover. Rerouting conductor element 56 may be employed to place contacts on substrate 10 for coupling with a probe assembly operably coupled to a tester.

Figure 4A:
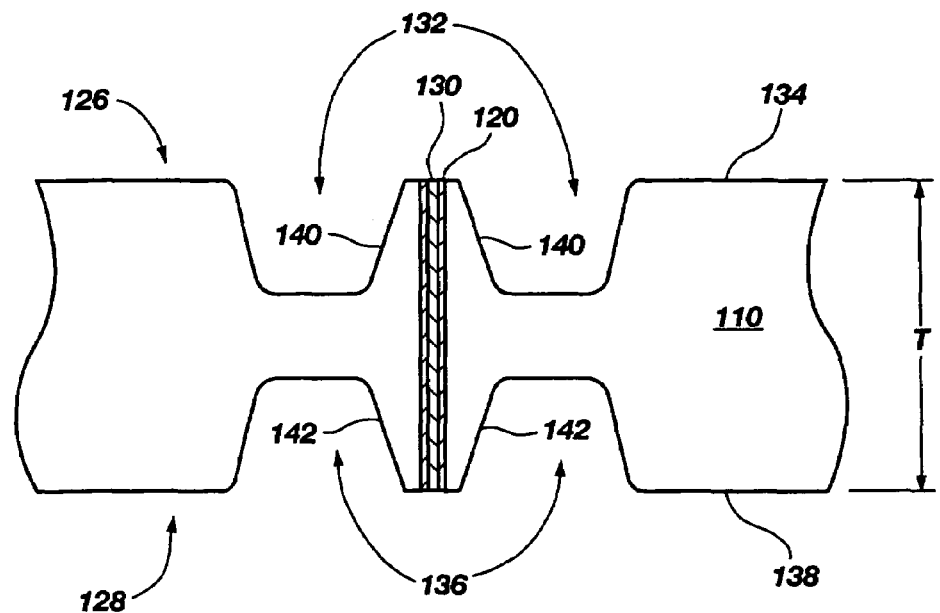
FIGS. 4A-4B are cross-sectional views illustrating a sequence of processing steps for fabricating a dual-sided compliant contact structure in accordance with another embodiment of the present invention.
Figure 4B:
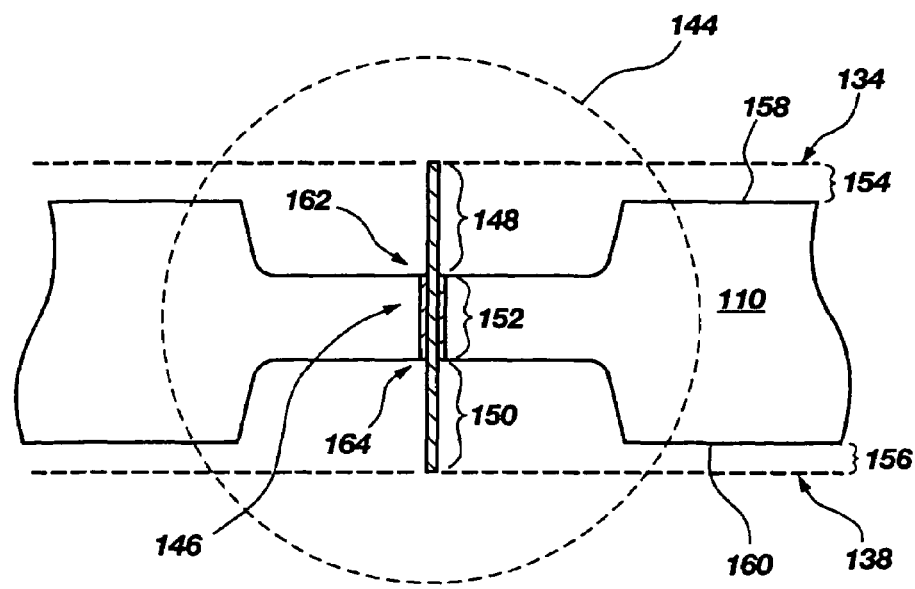

FIGS. 4A-4B are cross-sectional views illustrating additional processing steps for forming a dual-sided compliant contact structure, in accordance with another embodiment of the present invention. This embodiment facilitates the formation of compliant contacts having laterally unsupported portions extending transversely to and beyond both sides of a substrate to facilitate formation of an in-line contactor card arrangement.

For the dual-sided compliant contact structure of FIGS. 4A-4B, the preliminary processing steps are not illustrated; however, processing proceeds according to the sequence described with respect to FIGS. 2A-2D wherein a substrate 110 has formed therein a contact slot through the entire thickness dimension of the substrate 110. When necessary, the substrate within the contact slot is passivated by an insulative layer 120 and a conductor 130 is formed within the contact slot. Specifically illustrated in FIG. 4A are further processing steps, namely the formation of a first contact bulk pit 132 formed on a first side 126 of substrate 110 beginning at a first original surface 134 and further circumscribing conductor 130 on the first side 126. Furthermore, a second contact bulk pit 136 is formed on a second side 128 of substrate 110 beginning at a second original surface 138 and further circumscribing conductor 130 on the second original surface 138. The substrate material in the contact bulk pits 132, 136 may be removed according to one or more of the substrate removal techniques previously described. When laser machining is selected, contact sidewalls 140 and 142 are initially retained around conductor 130. The dimensions of the contact bulk pits 132, 136 are determinable based upon the aforementioned criteria and are not further described herein.

FIG. 4B illustrates a further substrate removal process for forming a dual-sided compliant contact structure 144. A further substrate removal process includes one of the substrate etching processes described above which is preferential for the material of substrate 110, for example silicon, and preferentially does not etch the conductor 130. One example of such a preferential etch process is a TMAH: glycol wet etch process. The selected etch process removes portions of substrate 110 including contact sidewalls 140, 142 (FIG. 4A) and insulative layer 120 resulting in a dual-sided compliant contact 146 which includes on a first side thereof laterally unsupported portion 148 of conductor 130, a second side laterally unsupported portion 150 and a common portion 152 of conductor 130 fixed within substrate 110. Common portion 152 may be retained securely within substrate 110 in electrical isolation therefrom due to the presence of insulative layer 120 (where required) to facilitate electrical continuity and structural support of laterally unsupported portions 148, 150 of conductor 130.

Additionally, the substrate material removal process also creates exposure of dual-sided compliant contact 146 by respectively recessing the first original surface 134 and second original surface 138 of substrate 110 by first and second compliance distances 154, 156 to form first and second contact side stops 158, 160. As previously stated with respect to the prior embodiment, the recessing of contact side stops 158, 160 induces flexure of laterally unsupported portions 148, 150 of dual-sided compliant contact 146 during coupling of dual-sided compliant contact structure 144 with corresponding interfaces. While the dual-sided compliant contact structure 144 is illustrated as comprising symmetric first and second side compliant contact elements 162, 164, asymmetric contact structures on first and second sides of a substrate are also contemplated. For example, exposure and flexure of compliant contact elements 162, 164 may differ.

Figure 5:
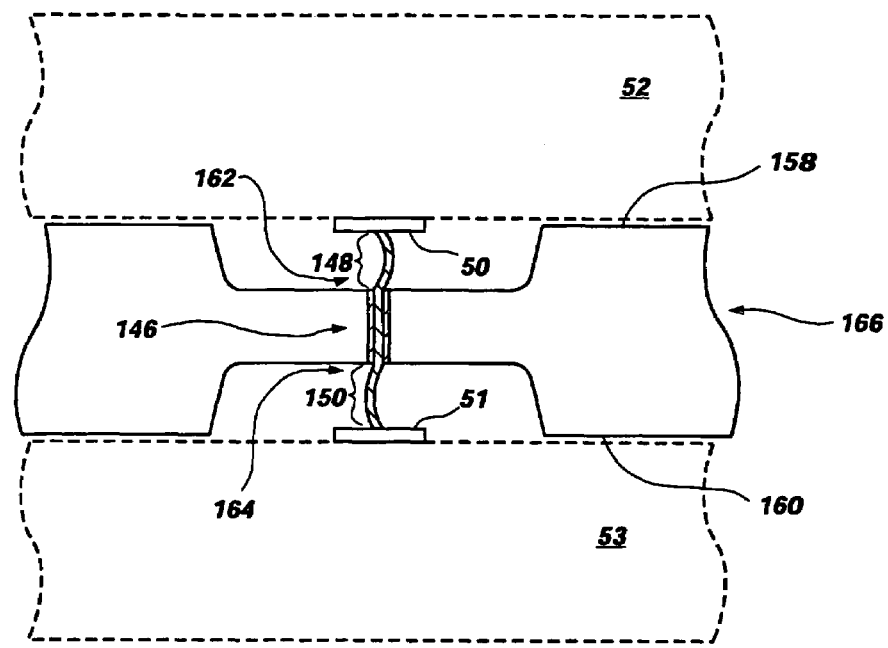
FIG. 5 illustrates a contactor card having a dual-sided compliant contact structure thereon operably coupling with a wafer-under-test, in accordance with an embodiment of the present invention.

FIG. 5 illustrates the coupling of a dual-sided compliant contact structure 144 embodied in a dual-sided contactor card 166 with a contact pad 50 of a semiconductor substrate such as a wafer-under-test 52 and a contact pad 51 of a test probe card 53. Coupling of wafer-under-test 52 with test probe card 53 results in the corresponding compliant response in respective first and second side laterally unsupported portions 148, 150 comprising compliant contact elements 162, 164 of dual-sided compliant contact 146. As is evident in FIG. 5, side stops 158, 160 limit the maximum flexure travel of compliant contact elements 162, 164 when another substrate such as a wafer-under-test or a test probe card is placed adjacent substrate 110.

Figure 6A:
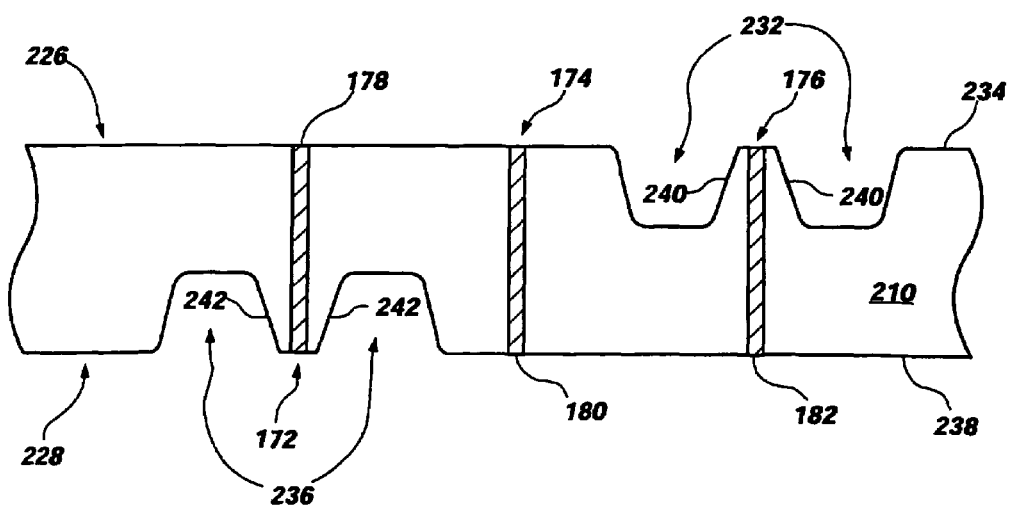
FIGS. 6A-6B are cross-sectional views illustrating a sequence of processing steps for fabricating a dual-sided compliant contact structure in accordance with another embodiment of the present invention.
Figure 6B:
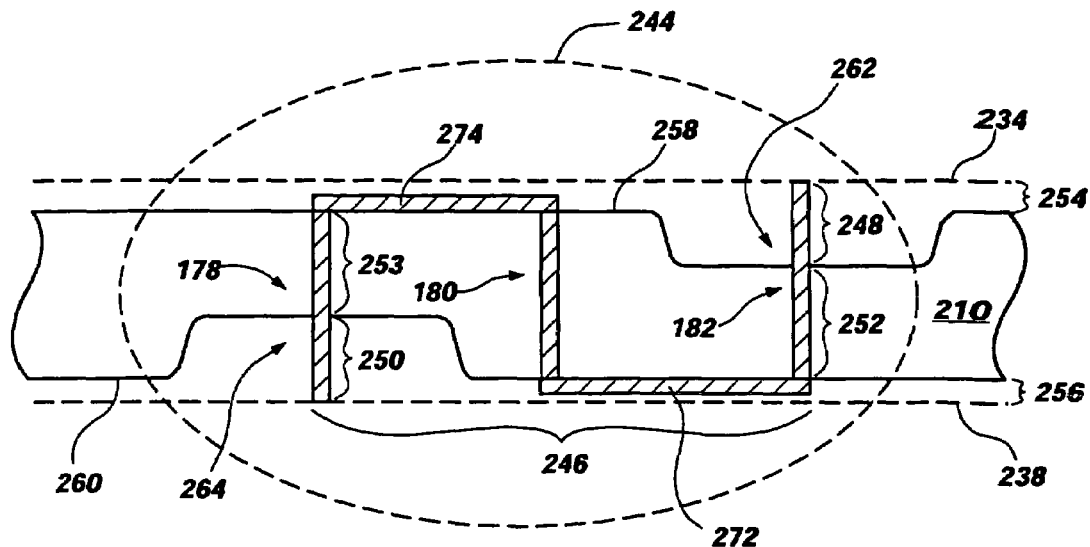

FIGS. 6A-6B illustrate a dual-sided complex compliant contact structure comprising operably coupled compliant contact structures similar to those described in conjunction with FIGS. 2A-2F and 3 in accordance with another embodiment of the present invention. This embodiment facilitates the formation of compliant contacts projecting from both sides of a substrate to accommodate formation of an offset contactor card arrangement. For the dual-sided compliant contact structure of FIGS. 6A-6B, the preliminary processing steps are not illustrated; however, processing proceeds according to the sequence described with respect to FIGS. 2A-2D wherein a substrate 210 has formed therein three contact slots 172, 174, 176 through the entire thickness dimension of the substrate 210. When necessary due to the material selected for substrate 210, the substrate material within the contact slots 172, 174, 176 is electrically isolated by dielectric layers (not shown herein for clarity) and individual conductors 178-182 are formed within the respective contact slots 172, 174, 176. The linking conductor 180 may be fabricated to provide an electrical interconnection between conductors 182 and 178. Specifically illustrated in FIG. 6A are further processing steps, namely the formation of a first contact bulk pit 232 is formed on a first side 226 of substrate 210 beginning at a first original surface 234 and further circumscribing conductor 182 on the first side 226. Furthermore, a second contact bulk pit 236 is formed on a second side 228 of substrate 210 beginning at a second original surface 238 and further circumscribing conductor 178 on the second side 228. The substrate material in the contact bulk pits 232, 236 may be removed according to one or more of the substrate removal techniques previously described. When laser machining is selected, contact sidewalls 240 and 242 are initially retained around conductors 182, 178, respectively.

FIG. 6B illustrates a further substrate removal process for further forming a dual-sided compliant contact structure 244. A further substrate removal process includes one of the substrate etching processes described above which is preferential for the material of substrate 210, for example silicon, and preferentially does not etch the conductors 178, 180, 182. One example of such a preferential etch process is a TMAH wet etch process. The selected etch process removes portions of substrate 210 including contact sidewalls 240, 242 (FIG. 6A) resulting in a dual-sided compliant contact 246 which includes on a first side, laterally unsupported portion 248 secured in substrate 210 by portion 252 of conductor 182 and, on a second side, laterally unsupported portion 250 secured in substrate 210 by portion 253 of conductor 178. As shown in FIG. 6B, additional electrically conductive traces 272, 274 may be formed on the opposing sides of substrate 210 to electrically couple together conductors 178 and 182 via linking conductor 180. Similar to the previous embodiments, the substrate material removal process also creates additional exposure for laterally unsupported portions 248, 250 by recessing the first original surface 234 and second original surface 238 of substrate 210 by first and second compliance distances 254, 256 to form first and second contact side stops 258, 260. The ends of linking conductor 180 will also be exposed by the etching process, and may be selectively removed as by abrasion prior to formation of electrically conductive traces 272, 274. As previously stated, the recessing of contact side stops 258, 260 induces flexure of laterally unsupported portions 248, 250 during coupling of dual-sided compliant contact structure 244 with other substrates placed adjacent to substrate 210. Furthermore, while the dual-sided compliant contact structure 244 is illustrated as comprising linked, symmetric first and second side contact structures 262, 264, asymmetric contact structures on first and second sides are also contemplated. For example, exposure and thus flexure of laterally unsupported portions 248, 250 may differ.

Figure 7:
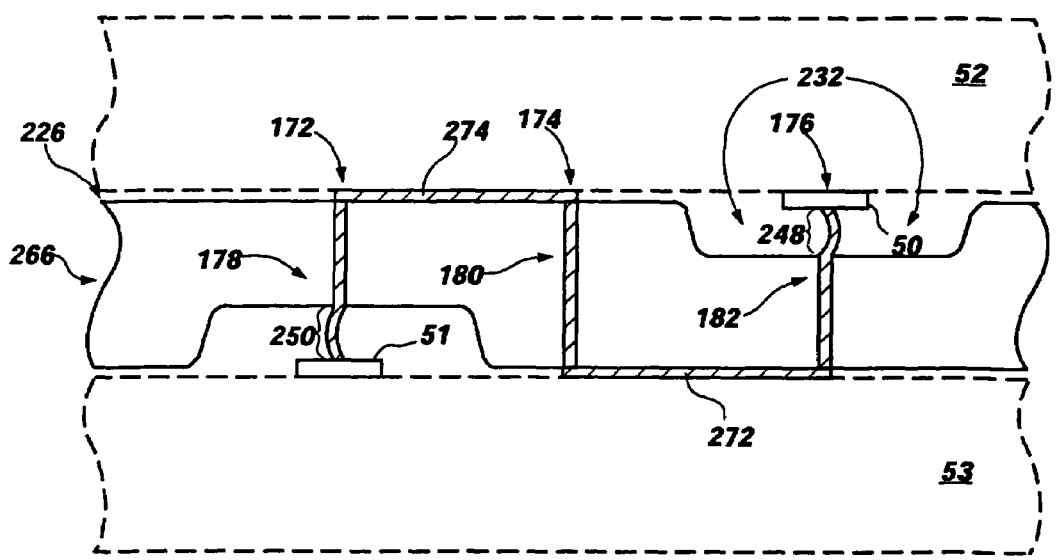
FIG. 7 illustrates a contactor card having a dual-sided compliant contact structure thereon operably coupling with a wafer-under-test, in accordance with an embodiment of the present invention.

FIG. 7 illustrates the coupling of a dual-sided compliant contact structure 244 embodied in a dual-sided contactor card 266 with a contact pad 50 of a semiconductor substrate such as a wafer-under-test 52 and a contact pad 51 of a test probe card 53. Coupling of wafer-under-test 52 and test probe card 53 results in the corresponding compliant response in respective first and second side laterally unsupported portions 248, 250 with electrical continuity between compliant portions 248, 250 being established by electrically conductive traces 272, 274 in combination with linking conductor 180.

Figure 8:
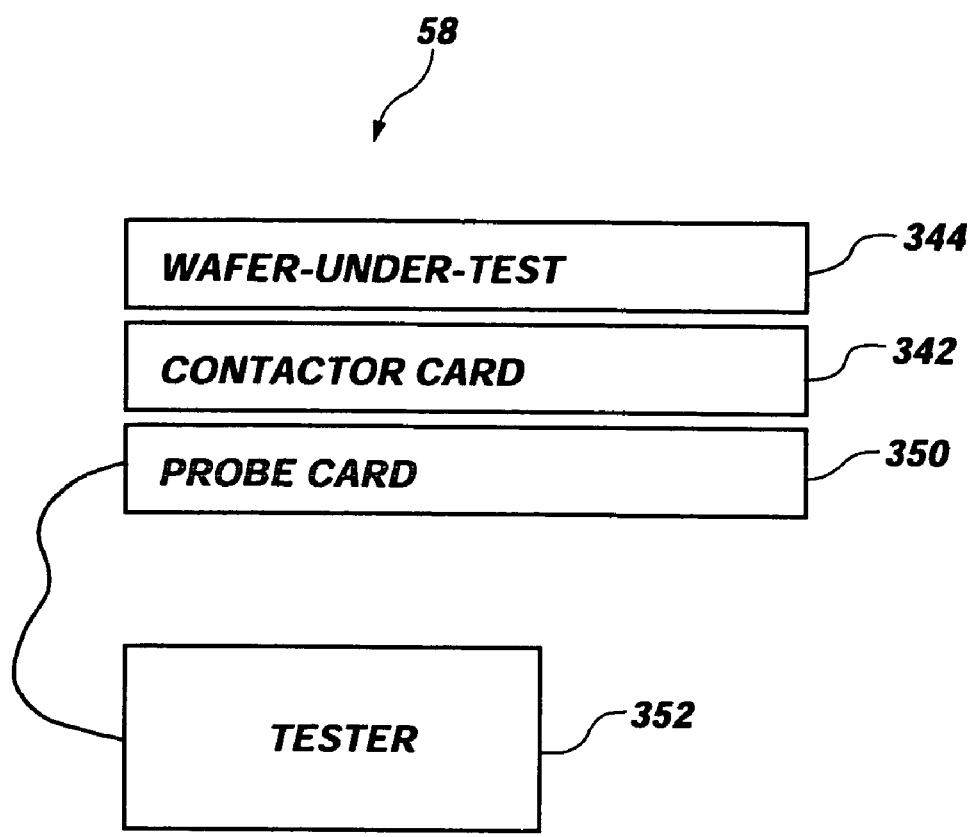
FIG. 8 is a block diagram of a testing system in accordance with an embodiment of the present invention.

FIG. 8 schematically illustrates a testing system 58 utilizing a contactor card 342 which includes one or more compliant contacts according to the invention and as described above. A wafer-under-test 344 having one or more contact pads thereon is operably coupled with the compliant contacts of contactor card 342. The compliant contacts are also operably coupled with contact pads or other elements of a test probe card 350 which is further operably coupled with a tester 352 to form a testing system 58. Contactor card 342 may be physically coupled with wafer-under-test 344 and/or the probe card 350 through the use of a physical coupling mechanism known by those of ordinary skill in the art, and so not further described herein.

The foregoing description of specific embodiments of the present invention has been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others of ordinary skill in-the art to best utilize the invention and various embodiments with various modifications. It is intended that the scope of the invention be identified by the claims appended hereto and their equivalents.

What is claimed is:

1. A method of testing a semiconductor substrate, comprising:

placing a substantially planar semiconductor substrate adjacent and substantially parallel to a substantially planar substrate of a contactor card;

aligning at least one contact pad of the substantially planar semiconductor substrate with a compliant contact of a compliant contact structure carried by the contactor card, the compliant contact structure including:

the compliant contact, including:

a portion fixed within a portion of the substrate; and at least one laterally unsupported portion integral with the portion fixed within the portion of the substrate, within a thickness of the substrate and extending beyond one side thereof;

pressing the semiconductor substrate against the contactor card substantially transversely to a plane of the substrate of the contactor card to cause an end of the at least one laterally unsupported portion extending beyond the one side of the substrate of the contactor card to contact the at least one contact pad of the semiconductor substrate and induce flexure of the at least one laterally unsupported portion; and applying at least one test signal from a tester operably coupled to the contactor card through the compliant contact.

2. The method of claim 1, further comprising arresting flexure of the at least one laterally unsupported portion by contacting the one side of the substrate of the contactor card with the semiconductor substrate.

3. The method of claim 2, further comprising at least partially receiving the at least one contact pad of the semiconductor substrate within a recess in the one side of the substrate of the contactor card peripherally surrounding the at least one laterally unsupported portion.

* * * * *